(12) United States Patent
He et al.

(10) Patent No.: US 12,457,871 B2
(45) Date of Patent: Oct. 28, 2025

(54) DISPLAY PANEL AND DISPLAY DEVICE

(71) Applicants: Hefei BOE Joint Technology Co., Ltd., Anhui (CN); BOE Technology Group Co., Ltd., Beijing (CN)

(72) Inventors: Min He, Beijing (CN); Can Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 17/909,995

(22) PCT Filed: Nov. 16, 2021

(86) PCT No.: PCT/CN2021/131014
§ 371 (c)(1),
(2) Date: Sep. 8, 2022

(87) PCT Pub. No.: WO2022/160873
PCT Pub. Date: Aug. 4, 2022

(65) Prior Publication Data
US 2023/0363224 A1  Nov. 9, 2023

(30) Foreign Application Priority Data

Jan. 29, 2021 (CN) .......................... 202110129187.5

(51) Int. Cl.
*H10K 59/131* (2023.01)
*G09G 3/3208* (2016.01)
(Continued)

(52) U.S. Cl.
CPC ....... *H10K 59/1315* (2023.02); *G09G 3/3208* (2013.01); *H10D 86/441* (2025.01);
(Continued)

(58) Field of Classification Search
CPC ............ H10K 59/131; H10K 59/1315; H10K 59/123; H10D 86/441; H10D 86/60;
(Continued)

(56) References Cited

U.S. PATENT DOCUMENTS 6,985,130 B2  1/2006  Nakayoshi et al.
9,799,679 B2  10/2017  Ning
(Continued)

FOREIGN PATENT DOCUMENTS

CN  104217994 A  12/2014
CN  104393001 A   3/2015
(Continued)

OTHER PUBLICATIONS

WO 2021226807—English Machine Translation (Year: 2025).*
(Continued)

*Primary Examiner* — Jose R Diaz
(74) *Attorney, Agent, or Firm* — XSENSUS LLP

(57) ABSTRACT

The display panel comprises a pixel driving circuit; the pixel driving circuit comprises a switching transistor; the display panel further comprises a base substrate, a first conductive layer, and a third conductive layer which are sequentially stacked; the first conductive layer is located on one side of the base substrate, and at least part of the first conductive layer is used for forming a gate of the switching transistor; the third conductive layer is located on the side of the first conductive layer facing away from the base substrate, the third conductive layer comprises a second signal line, and the second signal line is connected to the gate of the switching transistor by means of a via hole; the square resistance of the third conductive layer is less than the square resistance of the first conductive layer.

20 Claims, 6 Drawing Sheets

(51) Int. Cl.
  *G09G 3/3233* (2016.01)
  *H10D 86/40* (2025.01)
  *H10D 86/60* (2025.01)

(52) U.S. Cl.
  CPC .......... *H10D 86/60* (2025.01); *G09G 3/3233* (2013.01); *G09G 2300/0819* (2013.01); *G09G 2300/0842* (2013.01); *G09G 2310/0262* (2013.01)

(58) Field of Classification Search
  CPC ............... G09G 3/3208; G09G 3/3233; G09G 2300/0819; G09G 2300/0426; G09G 2300/0842; G09G 2310/0262; G02F 1/136286; G02F 1/1368
  See application file for complete search history.

(56) References Cited

U.S. PATENT DOCUMENTS

| | | | |
|---|---|---|---|
| 2003/0085885 | A1 | 5/2003 | Nakayoshi et al. |
| 2007/0295960 | A1 | 12/2007 | Moriya et al. |
| 2016/0293628 | A1 | 10/2016 | Ning |
| 2021/0335269 | A1 | 10/2021 | Yuan et al. |

FOREIGN PATENT DOCUMENTS

| | | | |
|---|---|---|---|
| CN | 104393001 B | 10/2017 | |
| CN | 111369944 A | 7/2020 | |
| CN | 111429830 A | 7/2020 | |
| CN | 111834466 A | 10/2020 | |
| CN | 112885850 A | 6/2021 | |
| JP | 2003140626 A | 5/2003 | |
| JP | 2007329417 A | 12/2007 | |
| WO | 2016061940 A1 | 4/2016 | |
| WO | 2021203478 A1 | 10/2021 | |
| WO | WO-2021226807 A1 * | 11/2021 | ............. H10D 86/60 |
| WO | WO-2022257081 A1 * | 12/2022 | ......... H10D 30/6755 |
| WO | WO-2022257082 A1 * | 12/2022 | ........... H10D 86/423 |
| WO | WO-2023035141 A9 * | 8/2024 | ........... H10K 59/131 |

OTHER PUBLICATIONS

WO 2022257081—English Machine Translation (Year: 2025).*
WO 2022257082—English Machine Translation (Year: 2025).*
WO 2023035141—English Machine Translation (Year: 2025).*
International Search Report issued Jan. 25, 2023 in corresponding International Patent Application No. PCT/CN2021/131014 (with English translation), 6 pages.
Written Opinion of the International Searching Authority issued Jan. 25, 2023 in corresponding International Patent Application No. PCT/CN2021/131014 (with English translation), 4 pages.

* cited by examiner

DISPLAY PANEL AND DISPLAY DEVICE

CROSS-REFERENCE TO RELATED APPLICATION

The present application is a 35 U.S.C. 371 national phase application of PCT International Application No. PCT/CN2021/131014 filed on Nov. 16, 2021 and entitled "Display Panel and Display Device", which claims the priority of Chinese Patent Application No. 202110129187.5 filed on Jan. 29, 2021 and entitled "Display Panel and Display Device", the disclosure of both are incorporated herein by reference as a part of the present application.

TECHNICAL FIELD

The present disclosure relates to the field of display technology, and in particular, to a display panel and a display device.

BACKGROUND

Generally, a display panel includes a pixel driving circuit, the pixel driving circuit includes a switching transistor, and a gate driving signal of the switching transistor is usually provided through a gate line. However, due to the RC loading of the gate line itself, the switching transistor in the pixel driving circuit has problems such as slow response speed and short response time, thus affecting the display effect.

It should be noted that the information disclosed in the above Background section is only for enhancement of understanding of the background of the present disclosure, and therefore may contain information that does not constitute the prior art that is already known to a person of ordinary skills in the art.

SUMMARY

According to an aspect of the present disclosure, a display panel is provided. The display panel includes a pixel driving circuit. The pixel driving circuit includes a switching transistor. The display panel further includes: a base substrate, a first conductive layer, and a third conductive layer. The first conductive layer is located on a side of the base substrate. At least part of the first conductive layer is configured to form the gate of the switching transistor. The third conductive layer is located on a side of the first conductive layer away from the base substrate. The third conductive layer includes a second signal line, and the second signal line is connected to the gate of the switching transistor through a via hole. The square resistance of the third conductive layer is less than the square resistance of the first conductive layer.

In an exemplary embodiment of the present disclosure, the first conductive layer includes a molybdenum layer. The third conductive layer includes: a first titanium layer, an aluminum layer, and a second titanium layer. The first titanium layer is located on a side of the first conductive layer away from the base substrate. The aluminum layer is located on a side of the first titanium layer away from the base substrate. The second titanium layer is located on a side of the aluminum layer away from the base substrate.

In an exemplary embodiment of the present disclosure, the pixel driving circuit further includes a driving transistor. The switching transistor is plural in number. The plurality of switching transistors include a first switching transistor, and a first terminal of the first switching transistor is connected to the gate of the driving transistor. The second signal line is plural in number. The plurality of second signal lines include a first gate line, and the first gate line is connected to the gate of the first switching transistor.

In an exemplary embodiment of the present disclosure, the second terminal of the first switching transistor is configured for receiving a data signal, and the plurality of switching transistors further includes a second switching transistor. The first terminal of the second switching transistor is connected to the gate of the driving transistor, and the second terminal of the second switching transistor is used for receiving a reference voltage.

The plurality of second signal lines further include a second gate line connected to the gate of the second switching transistor.

In an exemplary embodiment of the present disclosure, the display panel further includes a light emitting unit. A first terminal of the driving transistor is connected to a first electrode of the light emitting unit. The plurality of switching transistors further include a third switching transistor. The first terminal of the third switching transistor is connected to the first electrode of the light emitting unit, and the second terminal of the third switching transistor is used for receiving an initialization signal. The plurality of second signal lines further includes a third gate line, and the third gate line is connected to the gate of the third switching transistor.

In an exemplary embodiment of the present disclosure, the first conductive layer further includes a plurality of first signal line groups. Orthographic projections on the base substrate of the plurality of first signal line groups are arranged at intervals along a first direction. Each of the first signal line groups includes a plurality of first signal lines. Orthographic projections on the base substrate of the plurality of first signal lines in the same first signal line group are arranged at intervals along the second direction and extend along the second direction. The first direction and the second direction intersect with each other. The orthographic projections on the base substrate of the plurality of second signal lines extend along the first direction and are arranged at intervals along the second direction. The third conductive layer further includes a plurality of third signal line groups. Orthographic projections on the base substrate of the plurality of the third signal line groups are arranged at intervals along the first direction. The plurality of the third signal line groups are arranged in a one-to-one correspondence with the plurality of first signal line groups. Each of the third signal line groups includes a plurality of third signal lines. Orthographic projections on the base substrate of the plurality of third signal lines in the same third signal line group are arranged at intervals along the second direction and extend along the second direction. In the third signal line group and the first signal line group corresponding to each other, the plurality of first signal lines and the plurality of third signal lines are alternately connected in turn through via holes to form fourth signal lines. The intersection between the orthographic projection on the base substrate of the fourth signal line and the orthographic projection on the base substrate of the second signal line is located in the orthographic projection on the base substrate of the first signal lines in the fourth signal line.

In an exemplary embodiment of the present disclosure, the display panel further includes an active layer, the active layer is located between the base substrate and the first conductive layer, and the active layer includes a first active part. The first active part is configured to form a channel region of the first switching transistor. The first conductive layer further includes: a first conductive part and a first extension part. The orthographic projection on the base substrate of the first conductive part coincides with the orthographic projection on the base substrate of the first active part. The first conductive part is configured to form the gate of the first switching transistor. The first extension part is connected to the first conductive part. The orthographic projection on the base substrate of the first extension part extends along the second direction, and the first extension part is connected to the first gate line through a via hole. The orthographic projection on the base substrate of the second gate line is located at a side of the orthographic projection on the base substrate of the first conductive part. The orthographic projection on the base substrate of the first gate line is located at a side of the orthographic projection on the base substrate of the second gate line away from the orthographic projection on the base substrate of the first conductive part. The orthographic projection on the base substrate of the third gate line is located at a side of the orthographic projection on the base substrate of the first conductive part away from the orthographic projection on the base substrate of the second gate line.

In an exemplary embodiment of the present disclosure, the pixel driving circuit further includes a capacitor, a first electrode of the capacitor is connected to the gate of the driving transistor, and a second electrode of the capacitor is connected to the first terminal of the driving transistor. The active layer further includes a fourth active part, configured for forming a channel region of the driving transistor. The first conductive layer further includes a second conductive part. The orthographic projection on the base substrate of the second conductive part covers the orthographic projection on the base substrate of the fourth active part. At least part of the second conductive part is configured to form the gate of the driving transistor, and at least part of the second conductive part is further configured to form the first electrode of the capacitor. The display panel further includes a second conductive layer, the second conductive layer includes a third conductive part, and the third conductive part is configured to form a second electrode of the capacitor. The orthographic projection on the base substrate of the third conductive part at least partially overlaps with the orthographic projection on the base substrate of the second conductive part.

In an exemplary embodiment of the present disclosure, the plurality of fourth signal lines include: a plurality of power lines, and the power lines are configured to connect to the second terminal of the driving transistor. The third conductive layer further includes a first connection line. The first connection line is configured to connect to each power line. The orthographic projection on the base substrate of the first connection line extends along the first direction. The orthographic projection on the base substrate of the first connection line is located between the orthographic projection on the base substrate of the first conductive part and the orthographic projection on the base substrate of the third gate line.

In an exemplary embodiment of the present disclosure, the first direction is a row direction, the second direction is a column direction, and the display panel includes a plurality of pixel units arranged in rows and columns. Each pixel unit includes a plurality of pixel driving circuits arranged in the row direction. Each column of pixel units is provided with a respective power line. The orthographic projections on the base substrate of the plurality of pixel driving circuits in the same pixel unit are located between the orthographic projections on the base substrate of two adjacent power lines.

In an exemplary embodiment of the present disclosure, the first direction is a row direction, the second direction is a column direction, and the plurality of fourth signal lines further include: an initialization signal line, configured for providing the the initialization signal. The third conductive layer further includes a second connection line. The orthographic projection on the base substrate of the second connection line extends along the first direction. The orthographic projection on the base substrate of the second connection line is located at a side of the orthographic projection on the base substrate of the third gate line away from the orthographic projection on the base substrate of the first conductive part. The intersection between the orthographic projection on the base substrate of the second connection line and the orthographic projection on the base substrate of any fourth signal line is located in the orthographic projection on the base substrate of the first signal lines in the fourth signal line. The second connection line is connected to the first signal lines in the initialization signal line through via holes. The second connection line is connected to the second terminals of the plurality of third switching transistors in the same sub-pixel row.

In an exemplary embodiment of the present disclosure, the display panel includes a plurality of pixel units arranged in rows and columns, and each pixel unit includes a plurality of pixel driving circuits arranged along the row direction. Each column of pixel units is provided with a respective initialization signal line. The orthographic projection on the base substrate of the initialization signal line is located between the orthographic projections on the base substrate of two adjacent pixel driving circuits in the same pixel unit.

In an exemplary embodiment of the present disclosure, the plurality of fourth signal lines further include: a reference voltage line, where the reference voltage line is configured to provide the reference voltage. The third conductive layer further includes a third connection line. The orthographic projection on the base substrate of the third connection line extends along the first direction. The orthographic projection on the base substrate of the third connection line is located between the orthographic projection on the base substrate of the first gate line and the orthographic projection on the base substrate of the second gate line. The intersection between the orthographic projection on the base substrate of the third connection line and the orthographic projection on the base substrate of the fourth signal line is located in the orthographic projection on the base substrate of the first signal lines in the fourth signal line. The third connection line is connected to the first signal lines in the reference voltage line through via holes. The third connection line is connected with the second terminals of the plurality of second switching transistors in the same sub-pixel row.

In an exemplary embodiment of the present disclosure, each column of pixel units is provided with a respective reference voltage line, and the orthographic projection on the base substrate of the reference voltage line is located between the orthographic projections on the base substrate of two adjacent pixel driving circuits in the same pixel unit. In the same pixel unit, the orthographic projection on the base substrate of the reference voltage line and the orthographic projection on the base substrate of the initialization signal line are respectively located between the orthographic projections on the base substrate of two adjacent pixel driving circuits in different groups.

In an exemplary embodiment of the present disclosure, the third connection line is connected to the second terminals of the plurality of second switching transistors in the same pixel unit, and the orthographic projection on the base substrate of the third connection line is located between the orthographic projections on the base substrate of two adjacent power lines.

In an exemplary embodiment of the present disclosure, the plurality of fourth signal lines further include a data line, and the data line is configured to provide the data signal.

In an exemplary embodiment of the present disclosure, the first switching transistor includes two channel regions located in the active layer and spaced apart from each other; the second switching transistor includes two channel regions located in the active layer and spaced apart from each other; and the third switching transistor includes two channel regions located in the active layer and spaced apart from each other.

In an exemplary embodiment of the present disclosure, the orthographic projections on the base substrate of the first switching transistor, the second switching transistor, and the third switching transistor are located between the orthographic projection on the base substrate of the second gate line and the orthographic projection on the base substrate of the first connection line.

According to an aspect of the present disclosure, there is provided a display device including the above-mentioned display panel.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the description serve to explain the principle of the present disclosure. Obviously, the drawings in the following description are only some embodiments of the present disclosure, and for those of ordinary skill in the art, other drawings may also be obtained from these drawings without creative effort.

Figure 1:
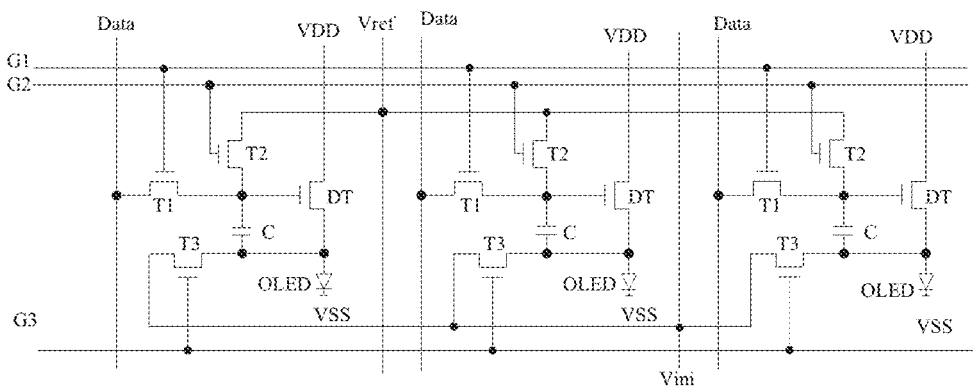
FIG. 1 is a schematic structural diagram of a pixel driving circuit in a conventional pixel unit.
Figure 4:
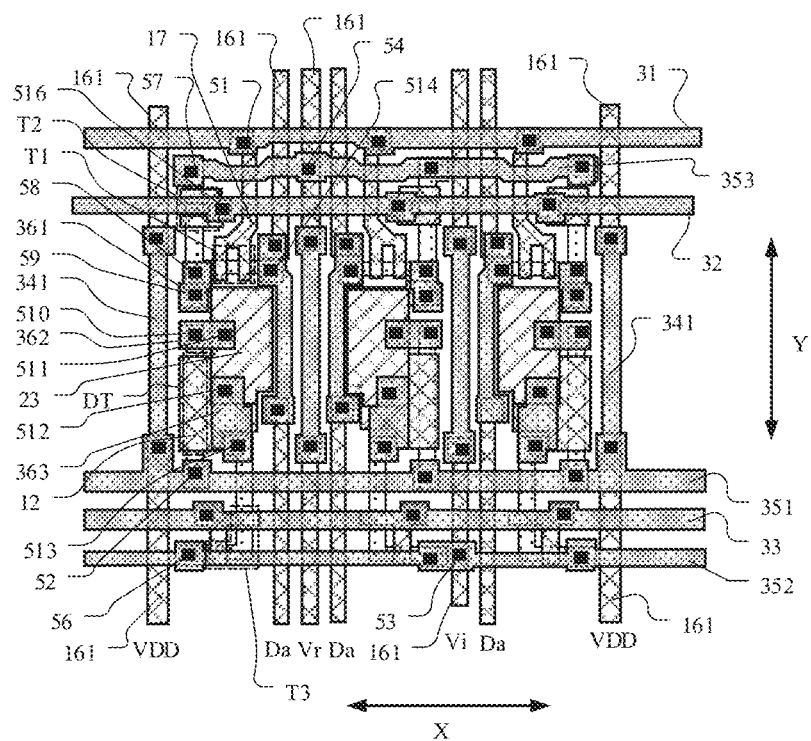
FIG. 4 is a structural layout of a display panel according to an exemplary embodiment of the present disclosure.
Figure 11:
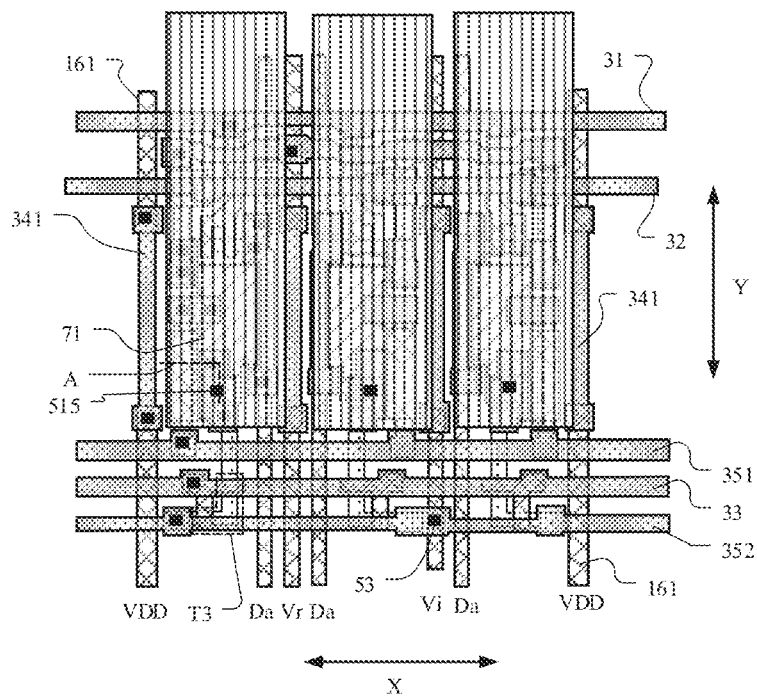
Figure 12:
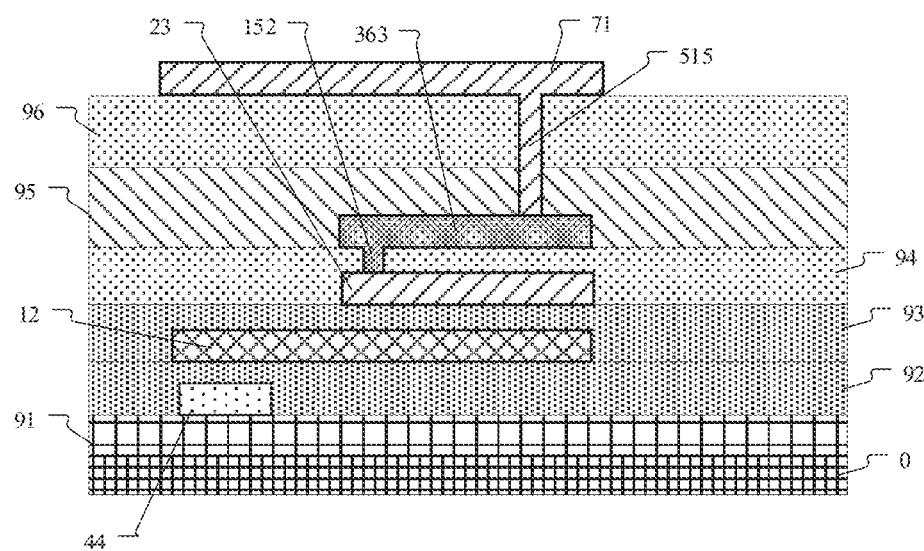

10 is a structural layout of the active layer, the first conductive layer, and the second conductive layer in FIG. 4;

FIG. 11 is a structural layout of a display panel according to another exemplary embodiment of the present disclosure; and FIG. 12 is a cross-sectional view taken along the dotted line A in FIG. 1.

DETAILED DESCRIPTION OF THE EMBODIMENTS

Example embodiments will now be described more fully with reference to the accompanying drawings. Example embodiments, however, may be embodied in various forms and should not be construed as limited to the examples set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

Although relative terms such as "upper" and "lower" are used in the present specification to describe the relative relationship of one component represented by an icon to another component, these terms are used in the present specification only for convenience, such as according to the direction in the example shown in the figures. It will be appreciated that if a device represented by an icon is turned upside down, a component described as being "on" the device will become a component being "under" the device. Other relative terms, such as "high", "low", "top", "bottom", "left" and "right", are also used to have similar meanings. When a certain structure is "on" another structure, it may mean that the certain structure is integrally formed on the other structure, or that the certain structure is "directly" arranged on the other structure, or that the certain structure is "indirectly" arranged on the other structure through a third structure.

The terms "a", "an", "the" are used to indicate the presence of one or more elements or components, etc. The terms "including" and "having" are used to indicate an open-ended inclusive meaning and refer that additional elements or components, etc. may be present in addition to the listed elements or components, etc.

As shown in FIG. 1, it is a schematic structural diagram of a pixel driving circuit in a conventional pixel unit. The pixel unit includes three pixel driving circuits. Each pixel driving circuit includes a driving transistor DT, a first switching transistor T1, a second switching transistor T2, a third switching transistor T3, and a capacitor C. The pixel driving circuit is configured for driving the light emitting unit OLED to emit light. The first terminal of the driving transistor DT is connected to the first electrode of the light emitting unit OLED, and the second terminal of the driving transistor DT is connected to the first power terminal VDD. The first terminal of the first switching transistor T1 is connected to the gate of the driving transistor DT, the second terminal of the first switching transistor T1 is connected to the data signal terminal Data, and the gate of the first switching transistor T1 is connected to the first gate driving signal terminal G1. The first terminal of the second switching transistor T2 is connected to the gate of the driving transistor DT, the second terminal of the second switching transistor T2 is connected to the reference voltage terminal Vref, and the gate of the second switching transistor T2 is connected to the second gate driving signal terminal G2. The first terminal of the third switching transistor T3 is connected to the first electrode of the light emitting unit OLED, the second terminal of the third switching transistor T3 is connected to the initialization signal terminal Vini, and the gate of the third switching transistor T3 is connected to the third gate driving signal terminal G3. The capacitor C is connected between the first terminal and the gate of the driving transistor DT. The second electrode of the light emitting unit OLED is connected to the second power terminal VSS. The driving transistor DT, the first switching transistor T1, the second switching transistor T2, and the third switching transistor T3 may be N-type transistors or P-type transistors, and the present exemplary embodiment uses N-type transistors as an example for description.

Figure 2:
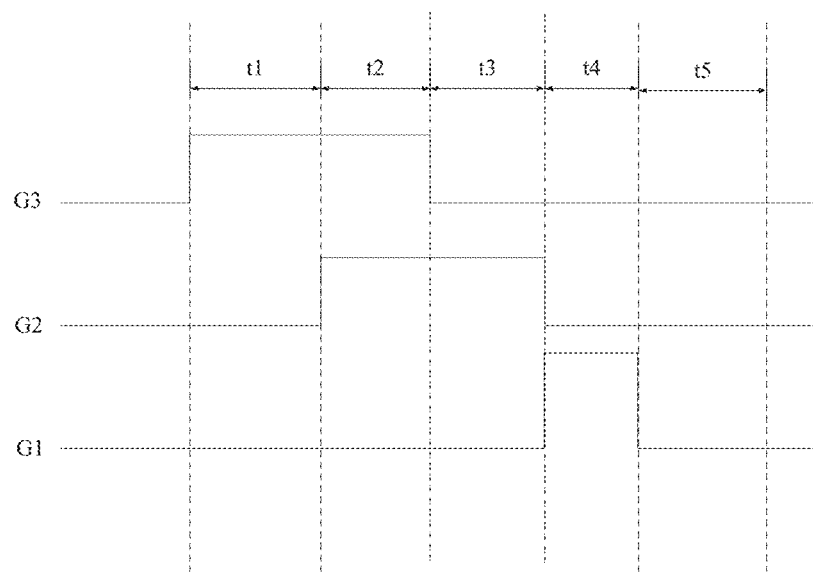
FIG. 2 is a timing diagram of each node in a driving method of the pixel driving circuit shown in FIG. 1.

The pixel driving circuit is an internal compensation circuit, as shown in FIG. 2, which is a timing diagram of each node in a driving method of the pixel driving circuit shown in FIG. 1. G1 represents the timing of the first gate driving signal terminal, G2 represents the timing of the second gate driving signal terminal, and G3 represents the timing of the third gate driving signal terminal. A driving method of the pixel driving circuit may include an initialization stage t1, a reference voltage writing stage t2, a threshold compensation stage t3, a data writing stage t4, and a light emitting stage t5. In the initialization stage t1, the third gate driving signal terminal G3 outputs a high level, the third switching transistor T3 is turned on, and the initialization signal terminal Vini writes an initialization signal to the first electrode of the light emitting unit OLED. In the reference voltage writing stage t2, each of the second gate driving signal terminal G2 and the third gate driving signal terminal G3 output a high level, the second switching transistor T2 and the third switching transistor T3 are turned on at the same time, and the reference voltage terminal Vref writes a reference voltage to the gate of the driving transistor through the second switching transistor T2. At this time, the gate voltage of the driving transistor is equal to the reference voltage, and the voltage at the first terminal is equal to the voltage of the initialization signal. In the threshold compensation stage t3, the second gate driving signal terminal G2 outputs a high level, the second switching transistor T2 is turned on, the driving transistor DT is turned on under the action of the reference voltage, and the first power terminal VDD charges the first terminal of the driving transistor until the gate-source voltage difference of the driving transistor is equal to the threshold voltage of the driving transistor. At this time, the voltage at the first terminal of the driving transistor is equal to Vref−Vth, where Vref is the reference voltage, and Vth is the threshold voltage of the driving transistor. In the data writing stage t4, the first gate driving signal terminal G1 outputs a high level, the first switching transistor T1 is turned on, and the data signal terminal Data writes a data signal to the gate of the driving transistor DT through the first switching transistor T1. In the light emitting stage t5, the output current formula of the driving transistor DT is $I=(\mu W C_{ox}/2L)(V_{gs}-V_{th})^2$, where $\mu$ is the carrier mobility; $C_{ox}$ is the gate capacitance per unit area; W is the width of the channel of the driving transistor; L is the length of the channel of the driving transistor; and $V_{gs}$ is the gate-source voltage difference of the driving transistor. The output current of the above driving transistor is $I=(\mu W C_{ox}/2L)(V_{data}-(V_{ref}-V_{th})-V_{th})^2$. The pixel driving circuit can avoid influences of the threshold value of the driving transistor on its output current.

Figure 3:
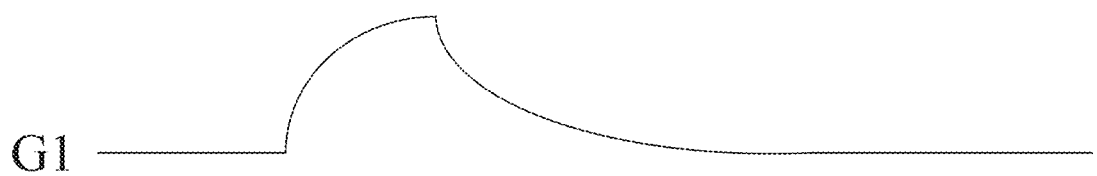
FIG. 3 is a signal timing diagram of a first gate driving signal terminal received by the pixel driving circuit shown in FIG. 1.

Generally, the gate driving signal may be provided to the first gate driving signal terminal G1 through the first gate line, the gate driving signal may be provided to the second gate driving signal terminal G2 through the second gate line, and the gate driving signal may be provided to the third gate driving signal terminal G3 through the third gate line. The gate of the above transistor is usually made of metal molybdenum material. At the same time, the first gate line, the second gate line, the third gate line, and the gate of the transistor are formed in the same layer. That is, the first gate line, the second gate line, the third gate line, and the gate of the transistor are formed by one patterning process. However, due to the large square resistance of the metal molybdenum, the RC loading of the first gate line, the second gate line, and the third gate line is large, thereby causing the gate driving signal received by the pixel driving circuit to be distorted. As shown in FIG. 3, it is a signal timing diagram of the first gate driving signal terminal G1 received by the pixel driving circuit shown in FIG. 1. It can be seen from FIG. 3 that under the effect of the impedance load of the first gate line itself, the rising and falling edges of the gate driving signal transmitted thereby are longer, and the time for the gate driving signal to reach the maximum voltage is shorter. That is, the gate driving signal cannot turn on the first switching transistor T1 in a timely and effective manner, so that the pixel driving circuit shown in FIG. 1 cannot effectively write data signals to the gate of the driving transistor during the data writing stage, which will eventually affect the display effect. Especially for the large-size display panels with high pixel density, the above-mentioned problems are particularly obvious due to the short data writing time. In addition, the impedance load of the second gate line and the third gate line themselves will also affect the response speed of the switching transistor connected thereto.

Figure 5:
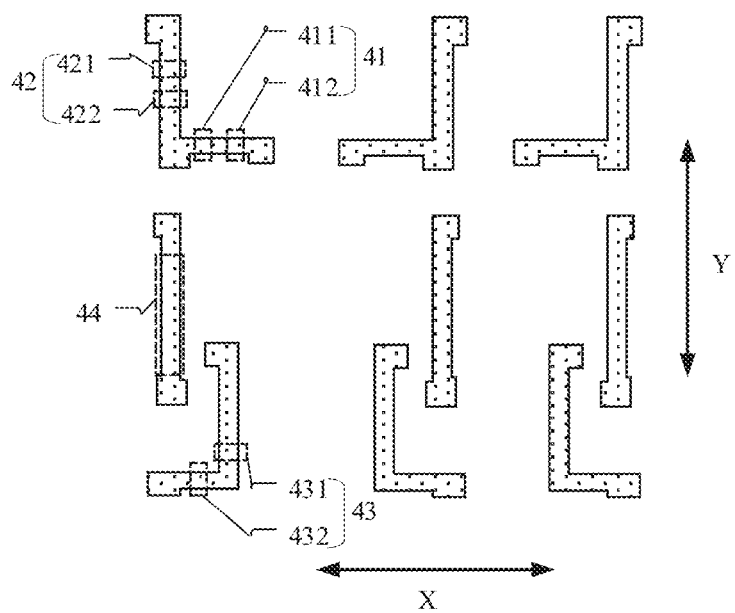
FIG. 5 is a structural layout of the active layer in FIG. 4.
Figure 6:
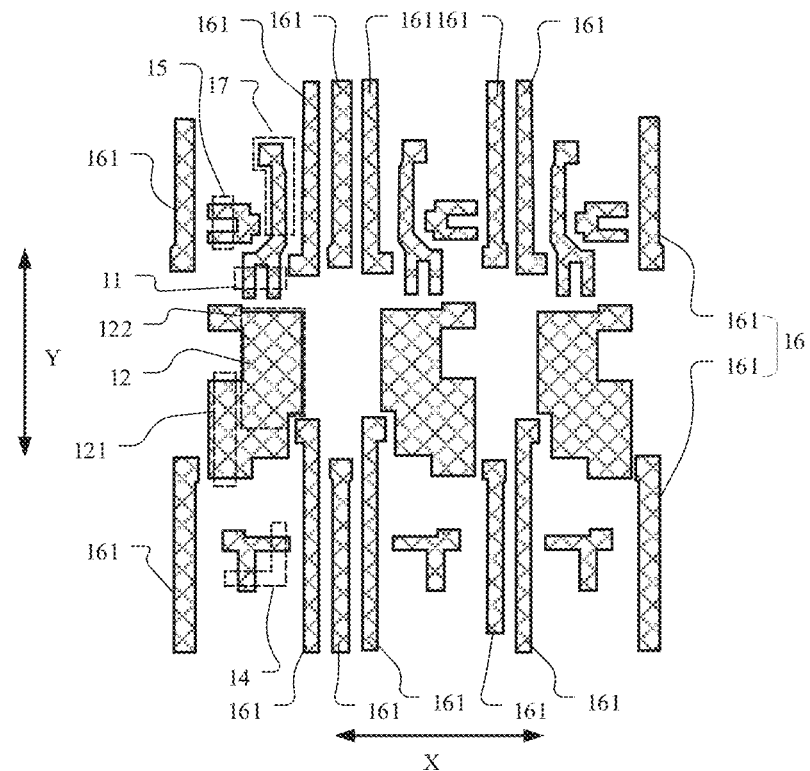
FIG. 6 is a structural layout of the first conductive layer in FIG. 4.
Figure 7:
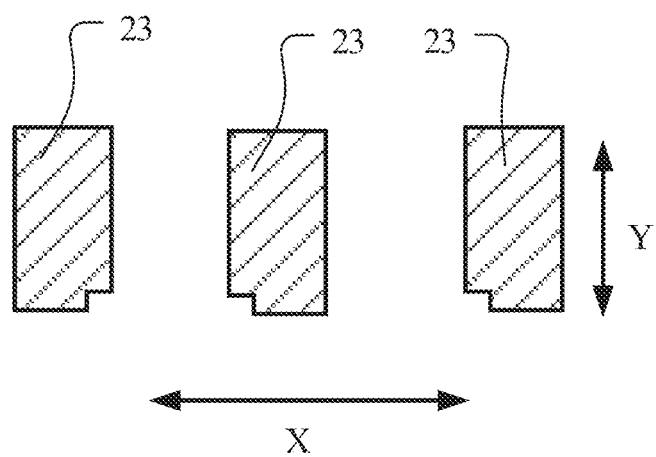
FIG. 7 is a structural layout of the second conductive layer in FIG. 4.
Figure 8:
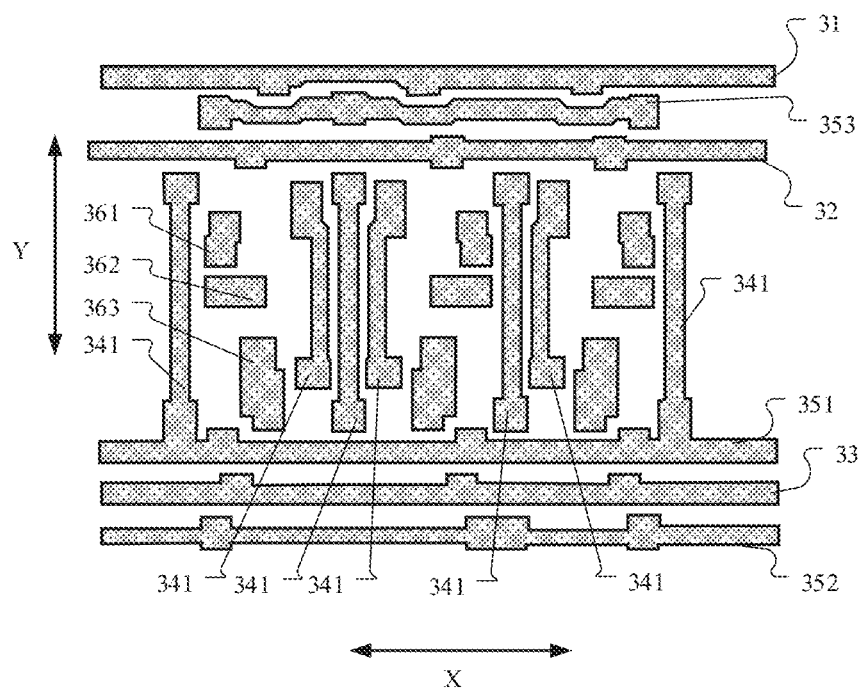
FIG. 8 is a structural layout of the third conductive layer in FIG. 4.
Figure 9:
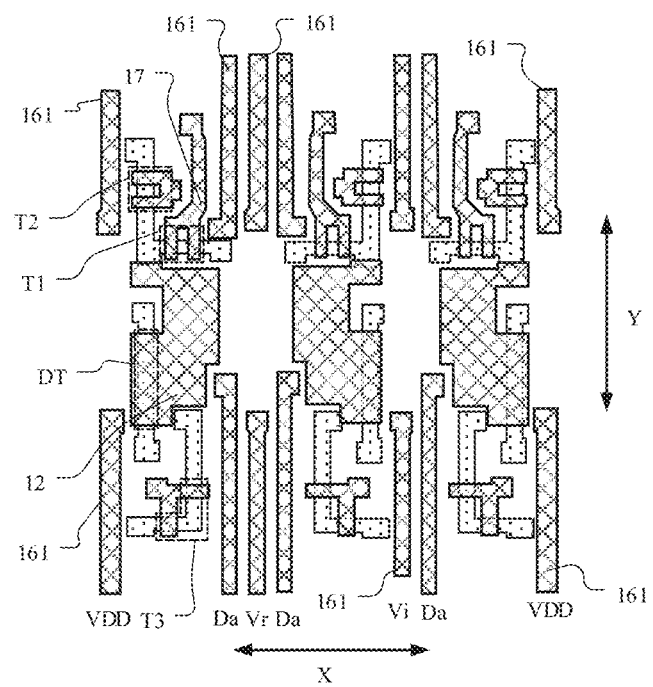
FIG. 9 is a structural layout of the active layer and the first conductive layer in FIG. 4.
Figure 10:
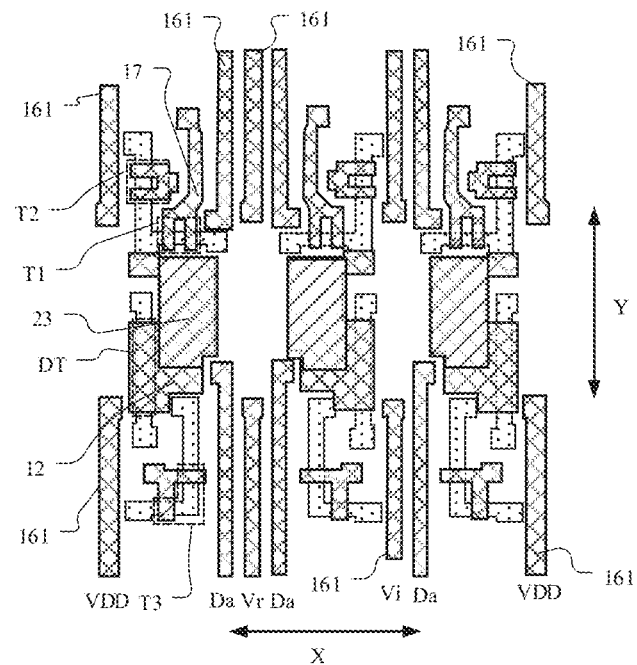

In view of above, an exemplary embodiment of the present disclosure provides a display panel, as shown in FIGS. 4-10. FIG. 4 is a structural layout of a display panel according to an exemplary embodiment of the present disclosure; FIG. 5 is a structural layout of the active layer in FIG. 4; FIG. 6 is a structural layout of the first conductive layer in FIG. 4; FIG. 7 is a structural layout of the second conductive layer in FIG. 4; FIG. 8 is a structural layout of the third conductive layer in FIG. 4; FIG. 8 is a structural layout of the active layer and the first conductive layer in FIG. 4; and FIG. 10 is a structural layout of the active layer, the first conductive layer, and the second conductive layer in FIG. 4.

The display panel may include the pixel driving circuit shown in FIG. 1. The display panel further includes: a base substrate, a first conductive layer, and a third conductive layer. The first conductive layer is located on a side of the base substrate. As shown in FIGS. 4, 6, 8, 9 and 10, the first conductive layer may include a first conductive part 11, a second conductive part 12, a fourth conductive part 14, and a fifth conductive part 15. The second conductive part 12 may include a first sub-conductive part 121. The first conductive part 11 may be configured for forming the gate of the first switching transistor T1. The first sub-conductive part 121 may be configured to form the gate of the driving transistor. The fourth conductive part 14 may be configured to form the gate of the third switching transistor T3. The fifth conductive part 15 may be configured to form the gate of the second switching transistor T2. The third conductive layer is located on a side of the first conductive layer away from the base substrate, and the third conductive layer may include a plurality of second signal lines. The plurality of second signal lines may include a first gate line 31, a second gate line 32 and a third gate line 33. The first gate line 31 may provide the first gate driving signal terminal G1 in FIG. 1, the second gate line 32 may provide the second gate driving signal terminal G2 in FIG. 1, and the third gate line 33 may provide the second gate driving signal terminal G3 in FIG. 1. The orthographic projections on the base substrate of the plurality of second signal lines (including the first gate line 31, the second gate line 32 and the third gate line 33) may extend along the first direction X and may be arranged at intervals along the second direction Y. The first gate line 31 may be connected to the gate of the first switching transistor T1 (the first conductive part 11), the second gate line 32 may be connected to the gate of the second switching transistor T2 (the fifth conductive part 15), and the third gate line 33 may be connected to the gate of the third switching transistor T3 (the fourth conductive part 14). The square resistance of the third conductive layer is smaller than the square resistance of the first conductive layer.

In an exemplary embodiment, the first gate line, the second gate line, and the third gate line are arranged on the third conductive layer with a smaller square resistance. Compared with the gate lines arranged on the first conductive layer with a higher square resistance, such arrangement reduces the impedance load of the first gate line, the second gate line and the third gate line themselves, thereby improving the response speed of the first switching transistor, the second switching transistor and the third switching transistor. By increasing the response speed of the first switching transistor, the writing speed of the data signal by the pixel driving circuit in the data writing stage may be improved. By increasing the response speed of the third switching transistor, the speed at which the pixel driving circuit writes the initialization signal to the first electrode of the light emitting unit in the initialization stage may be improved. By increasing the response speed of the second switching transistor, the speed at which the pixel driving circuit writes the reference voltage to the gate of the driving transistor during the reference voltage writing stage may be improved.

It should be understood that, in an exemplary embodiment, only part of the first gate line, the second gate line, and the third gate line may be provided on the third conductive layer, so as to reduce the impedance load of the part of the respective gate line. In other exemplary embodiments, the pixel driving circuit in the display panel may also have other structures, and the gate of any switching transistor in the pixel driving circuit may be disposed on the first conductive layer, so that a gate for providing the gate driving signal to the switching transistor may be disposed on the third conductive layer.

In an exemplary embodiment, the first conductive layer may include a molybdenum layer. The third conductive layer includes: a first titanium layer, an aluminum layer, and a second titanium layer. The first titanium layer may be located on a side of the first conductive layer away from the base substrate. The aluminum layer may be located on a side of the first titanium layer away from the base substrate. The second titanium layer may be located on a side of the aluminum layer away from the base substrate. The molybdenum layer may be formed of metal molybdenum material. The first titanium layer and the second titanium layer are formed of metal titanium. The aluminum layer is formed of metal aluminum.

In an exemplary embodiment, as shown in FIGS. 4, 6, 9, and 10, the first conductive layer may further include a plurality of first signal line groups 16, and each of the first signal line groups may include a plurality of first signal lines 161 The orthographic projections on the base substrate of the plurality of first signal line groups may be arranged along the first direction X at intervals. The orthographic projections on the base substrate of the plurality of first signal lines 161 in the same first signal line group may be arranged at intervals and extend along the second direction Y. The first direction and the second direction may intersect with each other. For example, the first direction X may be a row direction, and the second direction may be a column direction. As shown in FIG. 8, the third conductive layer may further include a plurality of third signal line groups, and each of the third signal line groups may include a plurality of third signal lines 341. The orthographic projections on the base substrate of the plurality of the third signal line groups may be arranged along the first direction X at intervals. The third signal line groups are arranged in a one-to-one correspondence with the first signal line groups 16. The orthographic projections on the base substrate of the plurality of third signal lines 341 in the same third signal line group may be arranged along the second direction Y at intervals and extend along the second direction Y. As shown in FIG. 8, since FIG. 8 is a partial structural layout of the display panel, only one third signal line 341 in the third signal line group is shown in FIG. 8. As shown in FIG. 4, in the third signal line group and the first signal line group 16 corresponding to each other, the plurality of first signal lines 161 and the plurality of third signal lines 341 may be alternately connected in sequence through via holes to form a fourth signal line. That is, the fourth signal line includes the first signal lines 161 and the third signal lines 341 which are alternately arranged in sequence. As shown in FIG. 4, the fourth signal line may include a power line VDD, a data line Da, an initialization signal line Vi, and a reference voltage line Vr. The power line VDD may provide the first power terminal VDD shown in FIG. 1; the data line Da may provide the data signal terminal Data shown in FIG. 1; the initialization signal line Vi may be configured to provide the initialization signal terminal Vini shown in FIG. 1; and the reference voltage line Vr may be configured to provide the reference voltage terminal Vref shown in FIG. 1. The intersection between the orthographic projection on the base substrate of the fourth signal line (including the power line VDD, the data line Da, the initialization signal line Vi, and the reference voltage line Vr) and the orthographic projection on the base substrate of the the second signal line (including the first gate line 31, the second gate line 32, and the third gate line 33) may be located in the orthographic projection on the base substrate of the first signal line 161 in the fourth signal line. That is, the second signal line does not intersect with the third signal line 341. This arrangement helps to prevent the second signal line and the fourth signal line from being electrically connected. It should be noted that, in the structural layout shown by FIG. 4, the smallest repeating unit of the display panel, i.e., one power line VDD, is removed. The display panel provided by an embodiment of the present disclosure may include a plurality of the above-mentioned smallest repeating units.

It should be understood that, in other exemplary embodiments, the fourth signal line may only include part of the power line VDD, the data line Da, the initialization signal line Vi, and the reference voltage line Vr. In addition, the fourth signal line may further include other signal lines extending along the second direction Y. For example, the fourth signal line may further include a sensing signal line. The third signal line 341 in the fourth signal line may also be bridged by other conductive layers.

In an exemplary embodiment, as shown in FIGS. 4, 5, 9, and 10, the display panel may further include an active layer, and the active layer is located between the base substrate and the first conductive layer. The active layer may include a first active part 41, a second active part 42, a third active part 43, and a fourth active part 44. The first active part 41 is configured to form the channel region of the first switching transistor T1, the second active part 42 is configured to form the channel region of the second switching transistor T2, the third active part 43 is configured to form the channel region of the third switching transistor T3, and the fourth active part 44 is configured to form the channel region of the driving transistor DT. The orthographic projection on the base substrate of the first conductive part 11 coincides with the orthographic projection on the base substrate of the first active part 41. The orthographic projection on the base substrate of the first sub-conductive part 121 coincides with the orthographic projection on the base substrate of the fourth active part 44. The orthographic projection on the base substrate of the fourth conductive part 14 coincides with the orthographic projection on the base substrate of the third active part 43. The orthographic projection on the base substrate of the fifth conductive part 15 coincides with the orthographic projection on the base substrate of the second active part 42. The first active part 41 may include two sub-active parts 411, 412, the second active part 42 may include two sub-active parts 421, 422, and the third active part 43 may include two sub-active parts 431, 432. That is, the first switching transistor T1, the second switching transistor T2, and the third switching transistor T3 are all of the double-gate structure, and the transistors of the double-gate structure have a smaller leakage current.

As shown in FIGS. 4, 6, 9, and 10, the first conductive layer may further include a first extension part 17, and the first extension part 17 may be connected to the first conductive part 11. The orthographic projection on the base substrate of the first extension part 17 may extend along the second direction Y. The first extension part 17 may be connected to the first gate line 31 through a via hole 51, so as to connect the gate of the first switching transistor T1 and the first gate driving signal terminal. The orthographic projection on the base substrate of the second gate line 32 may be located at a side of the orthographic projection on the base substrate of the first conductive part 11. The orthographic projection on the base substrate of the first gate line 31 may be located at a side of the orthographic projection on the base substrate of the second gate line 32 away from the orthographic projection on the base substrate of the first conductive part 11. The orthographic projection on the base substrate of the third gate line 33 may be located at a side of the orthographic projection on the base substrate of the first conductive part 11 away from the orthographic projection on the base substrate of the second gate line 32. This arrangement helps to prevent the first extension part 17 and the third gate line 33 from overlapping with each other, thereby reducing the parasitic capacitance on the first gate line 31 and reducing the impedance load of the first gate line. As shown in FIG. 6, the second conductive part 12 may further include a second sub-conductive part 122, and the second sub-conductive part 122 may be configured to form the first electrode of the capacitor C.

As shown in FIGS. 4, 7, and 9, the display panel may further include a second conductive layer, and the second conductive layer may include a third conductive part 23. The orthographic projection on the base substrate of the third conductive part 23 at least partially coincides with the orthographic projection on the base substrate of the second conductive part 12. The third conductive part 23 may be configured to form the second electrode of the capacitor C. According to an exemplary embodiment of the present disclosure, in the light emitting stage of the pixel driving circuit, the gate of the driving transistor DT is in a floating state, and the gate of the driving transistor DT is easily affected by noise, thereby causing voltage fluctuations. For example, a parasitic capacitance is formed between the gate of the driving transistor DT and the data line Da, and the gate of the driving transistor DT is prone to voltage fluctuations because of the voltage change at the data line Da, thereby resulting in abnormal display. In an exemplary embodiment, the second electrode of the capacitor C is connected to the first electrode of the light emitting unit, and the voltage at the second electrode of the capacitor C is a constant value during the light emitting stage of the pixel driving circuit. That is, the voltage of the conductive part 23 is a constant value. Since the orthographic projection on the base substrate of the third conductive part 23 at least partially overlaps with the orthographic projection on the base substrate of the second conductive part 12, the third conductive part 23 causes a noise shielding effect to the second conductive part 12. This setting helps to reduce the influence of noise on the gate of the driving transistor during the light emitting phase.

In an exemplary embodiment, as shown in FIGS. 4 and 8, the third conductive layer may further include a first connection line 351, and the first connection line 351 may be connected to the fourth active part 44 through the via hole 52 to connect to the second terminal of the driving transistor DT. The first connection line 351 may be connected to each of the power lines VDD. The orthographic projection on the base substrate of the first connection line 351 may extend along the first direction X, and the orthographic projection on the base substrate of the first connection line 351 may be located between the orthographic projection on base substrate of the first conductive part 11 and the orthographic projection on the base substrate of the third gate line 13. The plurality of power lines VDD may be formed into a grid structure through the first connection line 351, so that the resistance of the power lines VDD in the extending direction thereof may be reduced, thereby reducing the voltage drop of the power signal on the power lines. In addition, since the orthographic projection on the base substrate of the first connection line 351 may be located between the orthographic projection on the base substrate of the first conductive part 11 and the orthographic projection on the base substrate of the third gate line 13, the overlapping between the first connection line 351 and the first extension part 17 can be avoided, and the impedance load of the first gate line can be reduced by reducing the parasitic capacitance on the first gate line 31.

In an exemplary embodiment, as shown in FIGS. 4 and 8, the display panel includes a plurality of pixel units arranged in rows and columns, and each pixel unit may include three pixel driving circuits arranged along the row direction. Each column of pixel units may be provided with a respective power line, and the orthographic projections on the base substrate of the plurality of pixel driving circuits in the same pixel unit may be located between the orthographic projections on the base substrate of two adjacent power lines. It should be understood that, in other exemplary embodiments, each pixel unit further includes other numbers of pixel driving circuits arranged along the row direction. Each pixel unit may be provided with other numbers of power lines accordingly.

In an exemplary embodiment, as shown in FIGS. 4 and 8, the third conductive layer further includes a second connection line 352. The orthographic projection on the base substrate of the second connection line 352 may extend along the first direction X. The orthographic projection on the base substrate of the second connection line 352 may be located at a side of the orthographic projection on the base substrate of the third gate line 33 away from the orthographic projection on the base substrate of the first conductive part 11. This setting helps to prevent the second connection line 352 from overlapping with the first extension part 17, so that the impedance load of the first gate line can be reduced by reducing the parasitic capacitance on the first gate line 31. As shown in FIG. 4, the intersection between the orthographic projection on the base substrate of the second connection line 352 and the orthographic projection on the base substrate of any of the fourth signal lines may be located in the orthographic projection on the base substrate of the first signal lines 161 in the fourth signal line. The is, the second connection line 352 does not intersect with any of the third signal lines 341. The second connection line 352 may be connected to the first signal line 161 in the initialization signal line Vi through the via hole 53, and the second connection line 352 may be connected to the second terminals of the plurality of third switching transistors T3 located in the same sub-pixel row. Thus, the second connection line 352 may provide initialization signals to a plurality of pixel driving circuits. As shown in FIG. 4, the second connection line 352 may be connected to the third active part 43 through the via hole 56, to connect to the second terminal of the third switching transistor T3. In an exemplary embodiment, the second connection line 352 may be connected to a plurality of initialization signal lines Vi, so that the plurality of initialization signal lines Vi may be formed into a grid structure. This setting helps to reduce the resistance of the initialization signal lines Vi in the extending direction thereof, so that the first electrode of the light emitting unit can be rapidly discharged in the initialization stage.

In an exemplary embodiment, each column of pixel units may be provided with one initialization signal line Vi, and the orthographic projection on the base substrate of the initialization signal line Vi may be located between the orthographic projections on the base substrate of two adjacent pixel driving circuits in the same pixel unit.

In an exemplary embodiment, as shown in FIGS. 4 and 8, the third conductive layer may further include a third connection line 353, and the orthographic projection on the base substrate of the third connection line 353 may extend along the first direction X. The orthographic projection on the base substrate of the third connection line 353 may be located between the orthographic projection on the base substrate of the first gate line 31 and the orthographic projection on the base substrate of the second gate line 32. The intersection between the orthographic projection on the base substrate of the third connection line 353 and the orthographic projection on the base substrate of the fourth signal line may be located in the the orthographic projection on the base substrate of the first signal line 161 in the fourth signal line. That is, the third connection line 353 does not intersect with any of the third signal lines 341. The third connection line 353 may be connected to the first signal line 161 in the reference voltage line Vr through the via hole 54. The third connection line 353 may be connected to the second terminals of the plurality of second switching transistors T2 in the same sub-pixel row. As shown in FIG. 4, the third connection line 353 may be connected to the second active part 42 through the via hole 57 to connect to the second terminal of the second switching transistor T2.

In an exemplary embodiment, as shown in FIG. 4, the third connection line 353 may be only connected to the second terminals of the plurality of second switching transistors T2 in the same pixel unit. For example, the third connection line 353 is only connected to three second switching transistors in the pixel unit. The the orthographic projection on the base substrate of the third connection line 353 may be located between the orthographic projections on the base substrate of two adjacent power lines VDD. This arrangement helps to prevent the third connection line 353 from overlapping with the power line VDD, thereby reducing the short circuit risk of the third connection line 353.

In an exemplary embodiment, as shown in FIG. 4, one of the reference voltage lines Vr may be set in each column of pixel units, and the orthographic projection on the base substrate of the reference voltage line Vr may be located between the orthographic projections on the base substrate of two adjacent pixel driving circuits in the same pixel unit. Besides, in the same pixel unit, the orthographic projection on the base substrate of the reference voltage line Vr and the orthographic projection on the base substrate of the initialization signal line Vi may be respectively located between the orthographic projections on the base substrate of two adjacent pixel driving circuits in different groups. As shown in FIG. 4, the orthographic projection on the base substrate of the reference voltage line Vr is located between the orthographic projections on the base substrate of two adjacent pixel driving circuits on the left side. The orthographic projection on the base substrate of the initialization signal line Vi is located between the orthographic projections on the base substrate of two adjacent pixel driving circuits on the right side. This setting helps to prevent the signal lines between two adjacent pixel driving circuits from being too dense.

In an exemplary embodiment, as shown in FIGS. 4 and 8, the third conductive layer may further include a first connection part 361, a second connection part 362 and a third connection part 363. The first connection part 361 may be connected to the second active part 42 through the via hole 58, and the first connection part 361 may be further connected to the second conductive part 12 through the via hole 59, thereby connecting the first terminal of the second switching transistor T2 and the gate of the driving transistor DT. The second connection part 362 may be connected to the fourth active part 44 through the via hole 510, and the second connection part 362 may be further connected to the third conductive part 23 through the via hole 511, so as to connect the first terminal of the driving transistor and the second electrode of the capacitor C. The third connection part 363 may be connected to the third conductive part 23 through the via hole 512, and the third connection part 363 may be further connected to the third active part 43 through the via hole 513, thereby connecting the first terminal of the third switching transistor T3 and the second electrode of the capacitor C. The data line Da may also be connected to the first active part 41 through the via hole 514 to connect the data signal terminal and the second terminal of the first switching transistor T1. The second gate line 32 may also be connected to the fifth conductive part 15 through the via hole 516 to connect the gate of the second switching transistor T2 and the second gate driving signal terminal G2.

In an exemplary embodiment, as shown in FIG. 4, the orthographic projections on the base substrate of the first switching transistor T1, the second switching transistor T2, and the third switching transistor T3 may all be located between the orthographic projection on the base substrate of the second gate line 32 and the orthographic projection on the base substrate of the first connection line 351. With this arrangement, the first switching transistor T1, the second switching transistor T2, and the third switching transistor T3 can be centrally arranged between the second gate line 32 and the first connection line 351, so that the first switching transistor T1, the second switching transistor T2, and the third switching transistor T3 are prevented from overlapping with other signal lines.

As shown in FIG. 11, which is a structural layout of the display panel according to another exemplary embodiment of the present disclosure. The display panel may further include an anode layer, and the anode layer is located on the side of the third conductive layer away from the base substrate. The anode layer may include a plurality of anode parts 71. As shown in FIG. 11, the anode parts 71 may be connected to the third connection part 363 through the via hole 515 to connect with the first terminal of the driving transistor DT.

In an exemplary embodiment, as shown in FIG. 12, it is a cross-sectional view taken along the dotted line A in FIG. 11. The display panel may further include a buffer layer 91, a first gate insulation layer 92, a second gate insulating layer 93, a dielectric layer 94, a first planarization layer 95, and a passivation layer 96. The base substrate 0, the buffer layer 91, the active layer, the first gate insulation layer 92, the first conductive layer, the second gate insulation layer 93, the second conductive layer, the dielectric layer 94, the third conductive layer, the first planarization layer 95, the passivation layer 96, and the anode layer are stacked in sequence. The material of the gate insulation layer may be silicon oxide, and the material of the dielectric layer and the passivation layer may be silicon nitride. The material of the buffer layer may be silicon nitride or silicon oxide. The material of the active layer may be polysilicon, metal oxide semiconductor, etc., and the material of the anode layer may be indium tin oxide. The display panel may further include a pixel definition layer. The pixel definition layer is located on a side of the anode layer away from the base substrate, and is configured to form an opening for the light emitting unit.

An exemplary embodiment of the present disclosure also provides a display device including the above-mentioned display panel. The display device may be a display device such as a mobile phone, a tablet computer, or the like.

Other embodiments of the present disclosure will readily occur to those skilled in the art upon consideration of the specification and practice of what is disclosed herein. The present application is intended to cover any variations, uses, or adaptations of the present disclosure that follow the general principle of the present disclosure and include common knowledge or techniques in the technical field not disclosed by the present disclosure. The specification and examples are to be regarded as exemplary only, with the true scope and spirit of the present disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

The invention claimed is:

1. A display panel, comprising:
a pixel driving circuit, comprising a switching transistor;
a base substrate;
a first conductive layer, located on a side of the base substrate, wherein at least part of the first conductive layer is configured to form a gate of the switching transistor; and
a third conductive layer, located on a side of the first conductive layer away from the base substrate, wherein the third conductive layer comprises a second signal line, and the second signal line is connected to the gate of the switching transistor through a via hole,
wherein a square resistance of the third conductive layer is smaller than a square resistance of the first conductive layer.

2. The display panel according to claim 1, wherein
the first conductive layer comprises a molybdenum layer; and
the third conductive layer comprises:
a first titanium layer, located on a side of the first conductive layer away from the base substrate;
an aluminum layer, located on a side of the first titanium layer away from the base substrate; and
a second titanium layer, located on a side of the aluminum layer away from the base substrate.

3. The display panel according to claim 1, wherein
the pixel driving circuit further comprises a driving transistor, the switching transistor is plural in number, the plurality of switching transistors comprise a first switching transistor, and a first terminal of the first switching transistor is connected to a gate of the driving transistor; and
the second signal line is plural in number, the plurality of second signal lines comprise a first gate line, and the first gate line is connected to a gate of the first switching transistor.

4. The display panel according to claim 3, wherein
a second terminal of the first switching transistor is configured to receive a data signal, and the plurality of switching transistors further comprise a second switching transistor, a first terminal of the second switching transistor is connected to the gate of the driving transistor, and a second terminal of the second switching transistor is configured to receive a reference voltage; and
the plurality of second signal lines further comprise a second gate line connected to a gate of the second switching transistor.

5. The display panel according to claim 4, wherein
the display panel further comprises a light emitting unit, a first terminal of the driving transistor is connected to a first electrode of the light emitting unit, the plurality of switching transistors further comprise a third switching transistor, a first terminal of the third switching transistor is connected to the first electrode of the light emitting unit, and a second terminal of the third switching transistor is configured to receive an initialization signal; and
the plurality of second signal lines further comprise a third gate line connected to a gate of the third switching transistor.

6. The display panel according to claim 5, wherein
the first conductive layer further comprises:
a plurality of first signal line groups, wherein orthographic projections on the base substrate of the plurality of first signal line groups are arranged at intervals along a first direction, each of the plurality of first signal line groups comprises a plurality of first signal lines, orthographic projections on the base substrate of the plurality of first signal lines in a same first signal line group are arranged at intervals and extend along a second direction, and the first direction intersects with the second direction;
orthographic projections on the base substrate of the plurality of second signal lines extend along the first direction and are arranged at intervals along the second direction; and
the third conductive layer further comprises:
a plurality of third signal line groups, wherein orthographic projections on the base substrate of the plurality of third signal line groups are arranged at intervals along the first direction, the plurality of third signal line groups are in a one-to-one correspondence with the plurality of first signal line groups, each of the plurality of third signal line groups comprises a plurality of third signal lines, and orthographic projections on the base substrate of the plurality of third signal lines in a same third signal line group are arranged at intervals and extend along the second direction, wherein in the third signal line group and the first signal line group corresponding to each other, the plurality of first signal lines and the plurality of third signal lines are alternately connected in turn through via holes to form fourth signal lines; and wherein an intersection between an orthographic projection on the base substrate of the fourth signal line and an orthographic projection on the base substrate of the second signal line is located in an orthographic projection on the base substrate of the first signal lines in the fourth signal line.

7. The display panel according to claim 6, wherein the plurality of fourth signal lines further comprises: a data line, configured to provide the data signal.

8. The display panel according to claim 6, wherein the display panel further comprises an active layer, the active layer is located between the base substrate and the first conductive layer, and the active layer comprises a first active part configured to form a channel region of the first switching transistor;

the first conductive layer further comprises:

a first conductive part, wherein an orthographic projection on the base substrate of the first conductive part coincides with an orthographic projection on the base substrate of the first active part, and the first conductive part is configured to form the gate of the first switching transistor, and a first extension part, connected to the first conductive part, wherein an orthographic projection on the base substrate of the first extension part extends along the second direction, and the first extension part is connected to the first gate line through a via hole;

an orthographic projection on the base substrate of the second gate line is located at a side of an orthographic projection on the base substrate of the first conductive part;

an orthographic projection on the base substrate of the first gate line is located at a side of an orthographic projection on the base substrate of the second gate line away from an orthographic projection on the base substrate of the first conductive part; and an orthographic projection on the base substrate of the third gate line is located at a side of an orthographic projection on the base substrate of the first conductive part away from an orthographic projection on the base substrate of the second gate line.

9. The display panel according to claim 8, wherein the pixel driving circuit further comprises: a capacitor, wherein a first electrode of the capacitor is connected to the gate of the driving transistor, and a second electrode of the capacitor is connected to a first terminal of the driving transistor;

the active layer further comprises: a fourth active part, configured to form a channel region of the driving transistor;

the first conductive layer further comprises: a second conductive part, wherein an orthographic projection on the base substrate of the second conductive part covers an orthographic projection on the base substrate of the fourth active part, at least part of the second conductive part is configured to form the gate of the driving transistor, and at least part of the second conductive part is further configured to form the first electrode of the capacitor; and the display panel further comprises: a second conductive layer comprising a third conductive part, wherein the third conductive part is configured to form a second electrode of the capacitor, wherein an orthographic projection on the base substrate of the third conductive part at least partially overlaps with an orthographic projection on the base substrate of the second conductive part.

10. The display panel according to claim 8, wherein the plurality of fourth signal lines comprise: a plurality of power lines, configured to connect to a second terminal of the driving transistor;

the third conductive layer further comprises:

a first connection line, configured to connect to each of the plurality of power lines, wherein an orthographic projection on the base substrate of the first connection line extends along the first direction, and the orthographic projection on the base substrate of the first connection line is located between an orthographic projection on the base substrate of the first conductive part and an orthographic projection on the base substrate of the third gate line.

11. The display panel according to claim 10, wherein the first direction is a row direction, the second direction is a column direction, the display panel comprises a plurality of pixel units arranged in rows and columns, and each of the plurality of pixel units comprises a plurality of pixel driving circuits arranged along the row direction; and each column of pixel units is provided with a respective power line, and an orthographic projection on the base substrate of the plurality of pixel driving circuits in a same pixel unit is located between orthographic projections on the base substrate of two adjacent power lines.

12. The display panel according to claim 11, wherein the first direction is a row direction, the second direction is a column direction, and the plurality of fourth signal lines further comprises an initialization signal line configured to provide the initialization signal; and the third conductive layer further comprises:

a second connection line, wherein an orthographic projection on the base substrate of the second connection line extends along the first direction, the orthographic projection on the base substrate of the second connection line is located at a side of an orthographic projection on the base substrate of the third gate line away from an orthographic projection on the base substrate of the first conductive part, an intersection between the orthographic projection on the base substrate of the second connection line and an orthographic projection on the base substrate of each fourth signal line is located in an orthographic projection on the base substrate of the first signal lines in the fourth signal line, the second connection line is connected to the first signal lines in the initialization signal line through via holes, and the second connection line is connected to second terminals of the plurality of third switching transistors located in a same sub-pixel row.

13. The display panel according to claim 12, wherein the display panel comprises a plurality of pixel units arranged in rows and columns, each of the plurality of pixel units comprising a plurality of pixel driving circuits arranged along the row direction; and each column of pixel units is provided with a respective initialization signal line, and an orthographic projection on the base substrate of the initialization signal line is located between orthographic projections on the base substrate of two adjacent pixel driving circuits in a same pixel unit.

14. The display panel according to claim 13, wherein the plurality of fourth signal lines further comprises: a reference voltage line, configured to provide the reference voltage; and the third conductive layer further comprises:

a third connection line, wherein an orthographic projection on the base substrate of the third connection line extends along the first direction, the orthographic projection on the base substrate of the third connection line is located between an orthographic projection on the base substrate of the first gate line and an orthographic projection on the base substrate of the second gate line, an intersection between the orthographic projection on the base substrate of the third connection line and an orthographic projection on the base substrate of the fourth signal line is located in an orthographic projection on the base substrate of the first signal lines in the fourth signal line, the third connection line is connected to the first signal lines in the reference voltage line through via holes, and the third connection line is connected to second terminals of the plurality of second switching transistors in a same sub-pixel row.

15. The display panel according to claim 14, wherein each column of pixel units is provided with a respective reference voltage line, and an orthographic projection on the base substrate of the reference voltage line is located between orthographic projections on the base substrate of two adjacent pixel driving circuits in a same pixel unit; and in a same pixel unit, an orthographic projection on the base substrate of the reference voltage line and an orthographic projection on the base substrate of the initialization signal line are respectively located between orthographic projections on the base substrate of two adjacent pixel driving circuits in different groups.

16. The display panel according to claim 14, wherein the third connection line is connected to second terminals of the plurality of second switching transistors in a same pixel unit, and an orthographic projection on the base substrate of the third connection line is located between orthographic projections on the base substrate of two adjacent power lines.

17. The display panel according to claim 10, wherein orthographic projections on the base substrate of the first switching transistor, the second switching transistor, and the third switching transistor are located between an orthographic projection on the base substrate of the second gate line and an orthographic projection on the base substrate of the first connection line.

18. The display panel according to claim 8, wherein the first switching transistor comprises two channel regions located in the active layer and spaced apart from each other;

the second switching transistor comprises two channel regions located in the active layer and spaced apart from each other; and the third switching transistor comprises two channel regions located in the active layer and spaced apart from each other.

19. A display device, comprising a display panel, the display panel comprising:

a pixel driving circuit, comprising a switching transistor;

a base substrate;

a first conductive layer, located on a side of the base substrate, wherein at least part of the first conductive layer is configured to form a gate of the switching transistor; and a third conductive layer, located on a side of the first conductive layer away from the base substrate, wherein the third conductive layer comprises a second signal line, and the second signal line is connected to the gate of the switching transistor through a via hole, wherein a square resistance of the third conductive layer is smaller than a square resistance of the first conductive layer.

20. The display device according to claim 19, wherein the first conductive layer comprises a molybdenum layer; and the third conductive layer comprises:

a first titanium layer, located on a side of the first conductive layer away from the base substrate;

an aluminum layer, located on a side of the first titanium layer away from the base substrate; and a second titanium layer, located on a side of the aluminum layer away from the base substrate.

* * * * *